United States Patent [19]

AbouSeido

[11] Patent Number: 5,777,501

[45] Date of Patent: Jul. 7, 1998

[54] DIGITAL DELAY LINE FOR A REDUCED JITTER DIGITAL DELAY LOCK LOOP

[75] Inventor: Maamoun AbouSeido, Ottawa, Canada

[73] Assignee: Mosaid Technologies Incorporated, Kanata, Canada

[21] Appl. No.: 638,809

[22] Filed: Apr. 29, 1996

[51] Int. Cl.[6] .................................................. H03K 5/15
[52] U.S. Cl. .......................... 327/274; 327/287; 327/269
[58] Field of Search .................................. 327/269–272,
327/274, 276–278, 280, 281, 284, 285,
287, 288, 261, 379, 211, 212, 266; 326/24,
27, 23, 56–58

[56] References Cited

U.S. PATENT DOCUMENTS

| 4,494,021 | 1/1985 | Bell et al. | 327/270 |
|---|---|---|---|
| 4,506,167 | 3/1985 | Little et al. | 327/211 |
| 4,797,586 | 1/1989 | Traa | 327/277 |
| 4,820,944 | 4/1989 | Herlein et al. | 327/287 |
| 5,012,142 | 4/1991 | Sonntag | 327/288 |
| 5,057,701 | 10/1991 | Miller, Jr. | 327/379 |
| 5,144,174 | 9/1992 | Murakami | 327/287 |
| 5,173,870 | 12/1992 | Sukashita et al. | 327/215 |
| 5,220,206 | 6/1993 | Tsang et al. | 327/269 |
| 5,243,240 | 9/1993 | Murakami et al. | 327/287 |
| 5,497,115 | 3/1996 | Millar et al. | 327/211 |
| 5,508,648 | 4/1996 | Banik | 327/203 |
| 5,565,817 | 10/1996 | Lakshmikumar | 327/288 |
| 5,581,207 | 12/1996 | Bazes | 327/269 |
| 5,596,610 | 1/1997 | Leung et al. | 327/287 |

FOREIGN PATENT DOCUMENTS

| 2-42814 | 2/1990 | Japan | 327/261 |
|---|---|---|---|
| 3-211914 | 9/1991 | Japan | 327/274 |
| 3428393 A1 | 2/1986 | Switzerland | 327/203 |
| 3443788 A1 | 6/1986 | Switzerland | 327/203 |

Primary Examiner—Timothy P. Callahan
Assistant Examiner—Eunja Shin
Attorney, Agent, or Firm—Pascal & Associates

[57] ABSTRACT

A delay line having variable delay comprising apparatus for receiving an input clock signal and for providing an inverted and non-inverted version thereof, a plurality of serially connected inverter stages each for receiving and translating the inverted and non-inverted versions of the input clock signal, inverted and non-inverted outputs of each of the inverter stages except a last inverter stage in series being cross-connected to inputs of an immediately following inverter stage, and apparatus for shunting outputs of one of the inverter stages to a pair of output nodes.

3 Claims, 4 Drawing Sheets

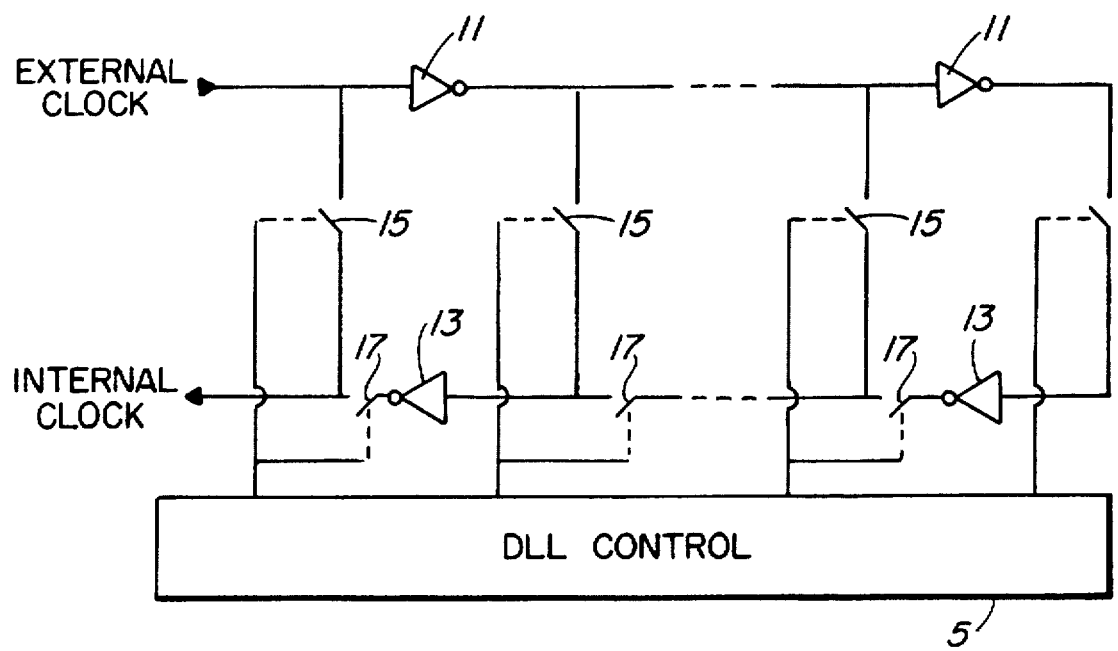
PRIOR ART
FIG. 3
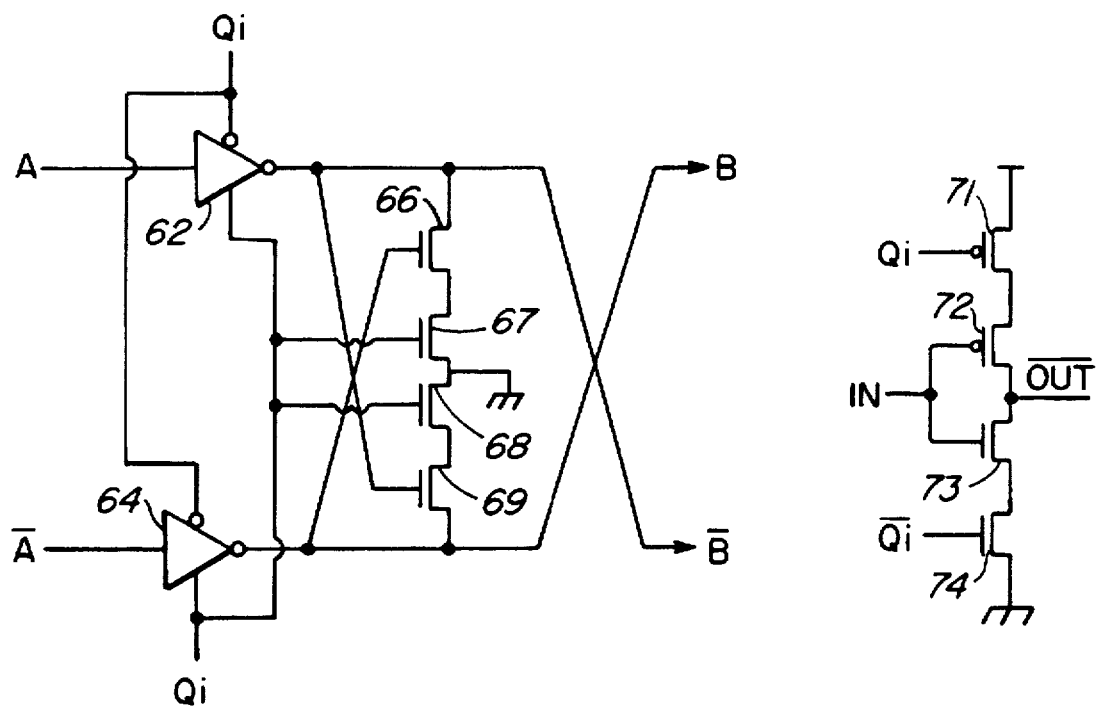
FIG. 4B
FIG. 4C

DIGITAL DELAY LINE FOR A REDUCED JITTER DIGITAL DELAY LOCK LOOP

FIELD OF THE INVENTION

This invention relates to the field of high frequency clock synchronization circuits, and can be usefully contained in a delay locked loop (DLL).

BACKGROUND TO THE INVENTION

Increasing the clock frequencies of electronic systems have added complex requirements for clock synchronization. In a system that requires an interface between different integrated circuits (ICs), it is important to be able to latch the input and output commands and data of the ICs in synchronization to the system external reference clock. It is also important to minimize on-chip clock signal distribution delays.

A conventional approach to solving these problems is to use an on-chip digital delay locked loop. The DLL is used in an attempt eliminate the clock distribution delay by adding a number of delay steps such that the total delay of the internal clock of the IC is an integral multiple of clock periods relative to the external clock.

FIG. 1 is a block diagram of a conventional delay locked loop. An external clock signal is applied to a digital delay line 1. An output of the delay line 1 is applied to a clock distribution tree 3, which generates plural internal clock signals. A version of the internal clock signal is applied to a delay comparator 5, which also receives the external clock signal. The delay comparator generates a delay line control signal which is applied to the delay line. This signal causes the output signal of the delay line 1 to appear at a tap position so that the internal clock has an integral multiple of clock periods of delay relative to the external clock.

FIG. 2 illustrates a tapped delay line which utilizes pairs of inverters 7, pairs being used so that the internal clock signal generated from the external clock signal is not inverted relative thereto. Delay taps are set by breaking the line at some point and shunting the output of the two inverter delay stage to an output line to provide the internal clock. In this figure, the shunting lines are interrupted by switches 9. A control signal from the DLL control output of the digital comparator and delay line control 5 causes operation of one of the switches 9, thus shunting the signal delayed by the inverters 7 to the internal clock line.

FIG. 3 illustrates another configuration of delay lines, wherein the delay step of the line is based on inverter-pair propagation delay. In this case, N inverters 11 are connected in series up the line, and N inverters 13 are connected in series down the line. Shunts containing switches 15 connect the inputs and outputs of inverters 11 to outputs and inputs of inverters 13. The switches 15 and 17 are operated by the DLL control 5. Delay taps are established by breaking the up line at a point along its length and shunting the output of the up line inverter upstream of the break to the input of the down line inverter at the break.

However, it has been found that in all the aforenoted prior art circuits, due to the nature of the delay locked loop once lock is achieved the internal clock will experience a timing jitter (or phase error) with respect to the external clock. This error is equal to or less than the delay through a single delay stage.

SUMMARY OF THE INVENTION

The present invention reduces the amount of timing jitter by providing a reduced delay in a single delay step. Thus instead of requiring the use of a pair of inverters in each delay step in order to make the output signal of the delay line uninverted relative to the input signal, only a single inverter delay is required in the present invention, while still achieving an uninverted output signal relative to the input signal. Due to the substantially reduced delay in each delay step, substantially reduced jitter can result.

The above is achieved in accordance with one embodiment of the invention in a delay line having variable delay comprising apparatus for receiving an input clock signal and for providing an inverted and non-inverted version thereof, a plurality of serially connected inverter stages each for receiving successively and translating the inverted and non-inverted version of the input clock signal, inverted and non-inverted outputs of each of the inverter stages except a last inverter stage in series being cross-connected to inputs of an immediately following inverter stage, and apparatus for shunting the outputs of one of the inverter stages to a pair of delay line output nodes.

In accordance with another embodiment, a delay line having variable delay is comprised of a plurality of serially connected delay cells, each delay cell comprising a single inverter stage formed of a pair of inverters, an input of each inverter of a first inverter stage being connected to a corresponding input line carrying a clock signal and an inverted clock signal respectively, outputs of the inverters of each inverter stage except a last inverter stage being crosscoupled to input terminals of a respective immediately following inverter stage, and apparatus for shunting outputs of inverters of one of the inverter stages to an output buffer for provision of opposite logic level output signals.

BRIEF INTRODUCTION TO THE DRAWINGS

A better understanding of the invention will be obtained by considering the detailed description below, with reference to the following drawings, in which:

FIGS. 2 and 3 illustrate prior art delay lines in a delay locked loop,

FIG. 4B is a schematic of a delay cell used in the preferred embodiment of the invention, FIG. 4C is a schematic of an inverter used in the preferred embodiment of the invention.

DETAILED DESCRIPTION OF THE PREFERRED EMBODIMENT

Figure 1:
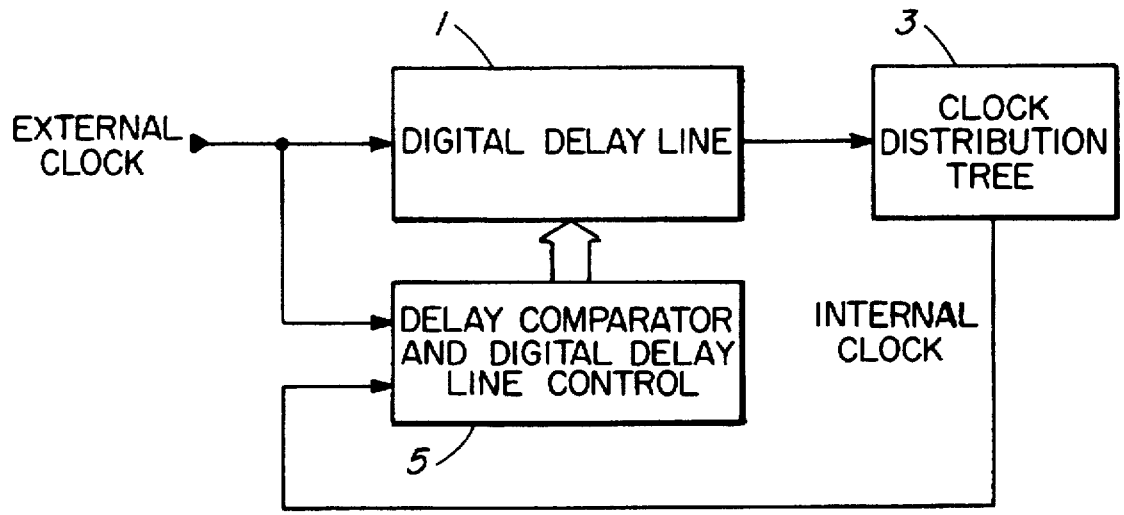
FIG. 1 is a block diagram of a conventional digital delay locked loop, illustrating the principle of operation of such circuit configurations.
Figure 2:
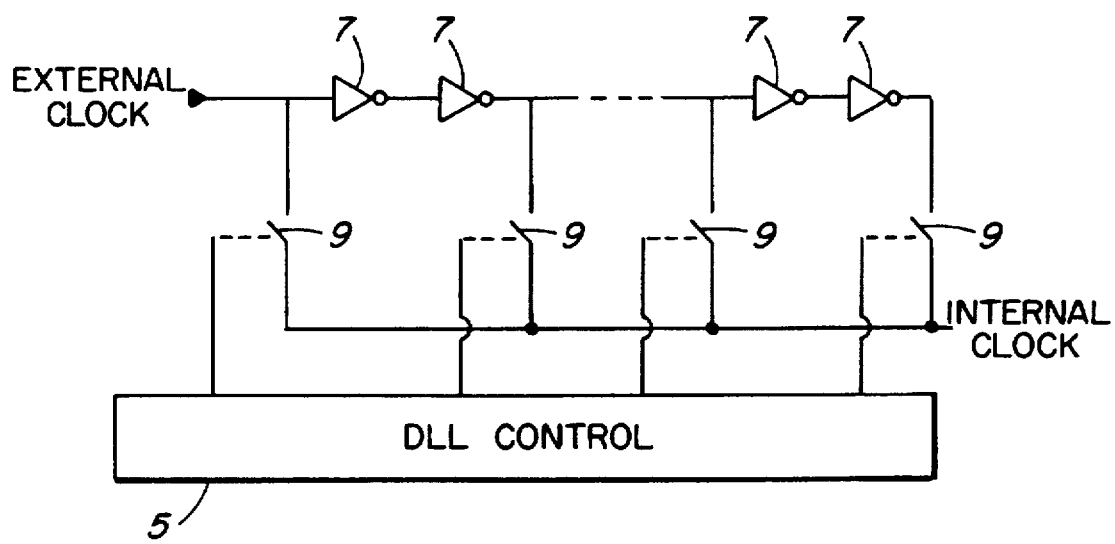
Figure 4A:
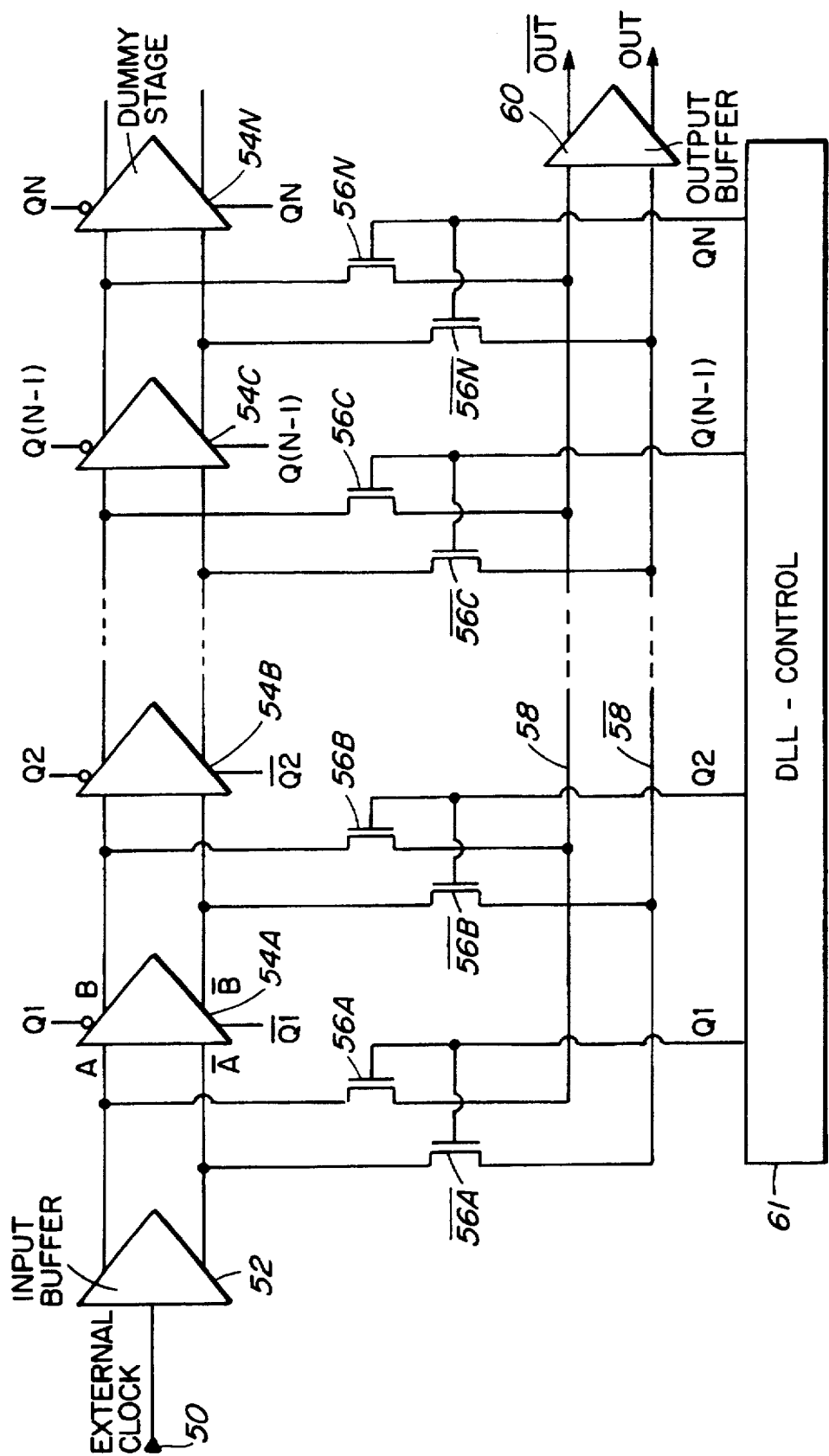
FIG. 4A is a schematic of the preferred embodiment of the invention.

Turning to FIG. 4A, an input clock source 50 provides a clock signal to an input buffer 52. The input buffer converts the clock signal to an inverted and to a non-inverted version of the clock signal, A and $\overline{A}$ respectively, and applies these signals to a first delay cell 54A. The delay cell 54A is connected in series with a plurality of similar delay cells 54B . . . 54N, thus forming a delay line, the output signal of the representative delay cell 54 shown applying its output signals B and $\overline{B}$ respectively to inputs of the following delay cell.

The outputs e.g. B, $\overline{B}$ of each of the delay cells of the delay line other than dummy loading stage 54N, and the inputs e.g. A, $\overline{A}$, of the first delay line are shunted by the source drain circuits of field effect transistors (FETs) 56A and $\overline{56A}$ respectively, 56B and $\overline{56B}$, ... 56N and $\overline{56N}$ to corresponding output lines 58 and $\overline{58}$. These output lines are connected to the input of an output buffer 60, from which opposite logic level output signals $\overline{OUT}$ and OUT may be obtained.

A delay control circuit 62 generates a control logic signal on one of its outputs Q1, Q2, Q3 ... QN. These outputs are respectively connected to gates of corresponding pairs of FETs 56A and $\overline{56A}$, 56B and $\overline{56B}$, 56C and $\overline{56C}$ ... 56N and $\overline{56N}$.

In a manner generally similar to the prior art described earlier, when the delay control circuit 62 generates a control logic signal on one of its outputs as noted above, it causes a corresponding pair of FETs to become conductive, which shunts the signal at the input of delay cell 54A or at the output of a delay cell 54A–54N to the output lines 58, $\overline{58}$, from which they pass through buffer 60 and appear as OUT, $\overline{OUT}$.

However in the present invention, each of the delay cells Q1-Q(N—1) is comprised of a pair of inverters which delay and pass the respective non-inverted and inverted versions of the clock signal. The outputs of the inverters are cross coupled to the output nodes of the delay cell. Thus, for example, the delayed version of the input A appears inverted on output $\overline{B}$, which is applied to the $\overline{A}$ input of the following delay cell, and is also applied to the output line $\overline{58}$ if that output is shunted by one of the shunt FETs.

Thus instead of a single clock signal being shunted as in the prior art, both inverted and non-inverted crosscoupled versions at the delay cell outputs are shunted.

The result is a propagation delay of only one inverter for each delay cell, and minimal jitter occurs when used in a delay locked loop.

A preferred form of any delay cell 54A, 54B ... 54(N—1) is shown in FIG. 4B. The delay cell is comprised of a pair of inverters 62 and 64 to which the signals on input A and input $\overline{A}$ are respectively applied. The outputs of inverters 62 and 64 are crosscoupled to the outputs of the delay cell, so that output B is taken from the output of inverter 64, to which is connected input $\overline{A}$, and output $\overline{B}$ is taken from the output of inverter 62, to which is connected input A.

The source-drain circuits of FETs 66 and 67 are connected in series between the output of inverter 62 and ground, and the source-drain circuits of FETs 68 and 69 are connected in series between the output of inverter 64 and ground. The gate of FET 69 is connected to the output of inverter 62, and the gate of FET 66 is connected to the output of inverter 64.

The delay cell control logic signal Qi from the delay locked loop control 61 is applied to the inverters 62 and 64, and also to the gates of FETs 67 and 68.

Thus it may be seen that with the control voltage Qi at high logic level, the inverters conduct and are operational. The signals at inputs A and $\overline{A}$ pass through, and are inverted. Thus a low logic level signal input to inverter 64 is inverted to high logic level, and is applied to the gate of FET 66, while the high logic level control signal is applied to the gates of FETs 67 and 68. The high logic level signal applied to the input of inverter 62 is inverted to low logic level and is applied to the gate of FET 69. As a result FET 66 conducts and FET 69 is inhibited. Since there is no operation voltage to the source or drain of FET 68, FET 68 is inhibited. However, with the application of high logic level voltage to the gate of FET 67, it conducts. As a result the output of inverter 62 is connected via FETs 66 and 67 to ground, and the output of inverter 64 is not.

The above sequence continues with inverse input signal logic level polarity, with the output of inverter 64 being pulled to ground and the output of inverter 62 not being pulled to ground.

The result is transmission of the original signal on inputs A and $\overline{A}$ being repeated on corresponding outputs B and $\overline{B}$ respectively, with no inversion and with only a single inverter delay.

A circuit which can form either of the inverters 62 and 64 is illustrated in FIG. 4C. The source-drain circuits of a pair of p-channel FETs 71 and 72 are connected in series between a voltage source and an output terminal $\overline{OUT}$. The source-drain circuits of a pair of n-channel FETs 73 and 74 are connected in series between ground and the output terminal $\overline{OUT}$. The input signal A or $\overline{A}$ is applied via an IN lead to the gates of FETs 72 and 73, and the control voltages Qi and $\overline{Qi}$ are applied to the gates of respective FETs 71 and 74.

The inverter operates similar to a well known CMOS inverter with respect to the input signal IN, except that the source-drain conductive paths to the power source and ground are switched conductive via FETs 71 and 74 by the application of the control voltage Qi and $\overline{Qi}$.

Figure 5:
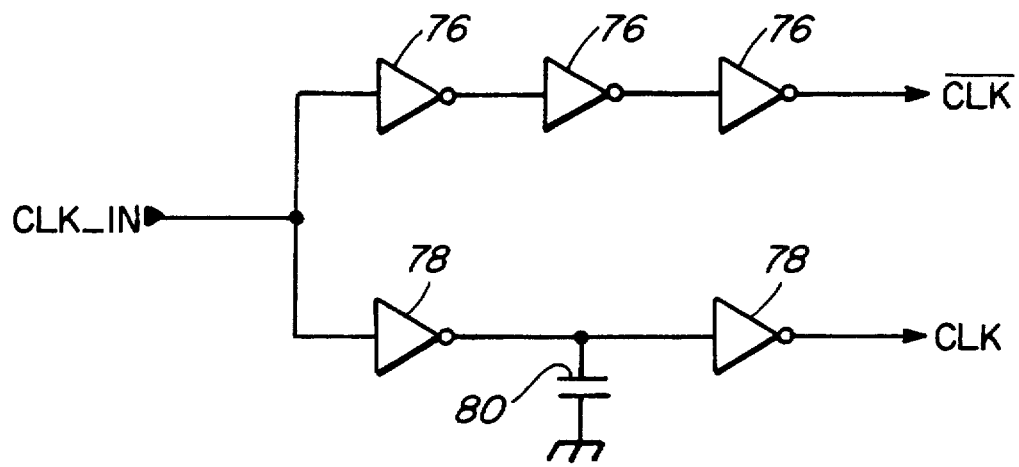
FIG. 5 is a schematic of an input buffer that can be used in the preferred embodiment of the invention.

A circuit for the input buffer 52 is shown in FIG. 5. An input clock signal is applied to the CLK_IN input, and is split into two circuit routes. One circuit route is comprised of a series of an odd number of inverters 76, three being shown as an example. The other route is comprised of a series of an even number of inverters 78. The outputs $\overline{CLK}$ and CLK are taken from the outputs of the routes, and constitute the two mutually inverted clock signals applied to the A and $\overline{A}$ inputs noted earlier. In order to delay the CLK signal so that it will be in phase with the $\overline{CLK}$ signal, a capacitor 80 is connected between the output of one inverter 78 and ground.

Figure 6:
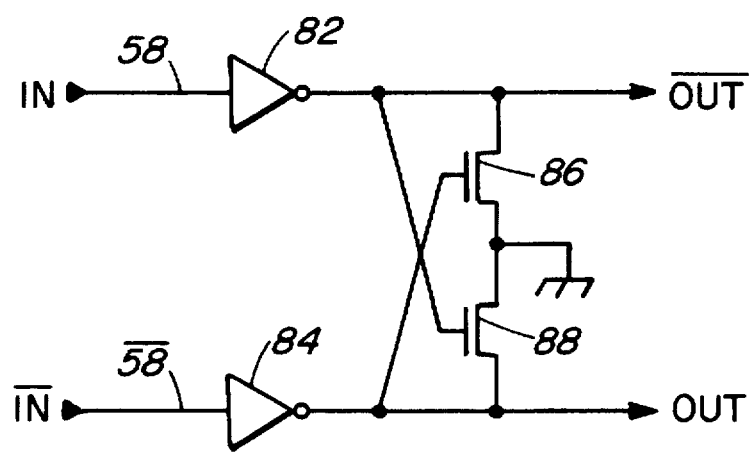
FIG. 6 is a schematic of an output buffer that can be used in the preferred embodiment of the invention.

A circuit for the buffer 60 is shown in FIG. 6. The input signals on lines 58 and $\overline{58}$ are applied to the inputs of respective inverters 82 and 84. The output signals $\overline{OUT}$ and OUT are taken from the outputs of inverters 82 and 84 respectively.

The output of inverter 82 is bypassed to ground via the source-drain circuit of FET 86, and the output of inverter 84 is bypassed to ground via the source-drain circuit of FET 88. The gate of FET 86 is connected to the output of inverter 84, and the gate of FET 88 is connected to the output of inverter 82.

Thus when opposite logic polarity signals appear at the outputs of inverters 82 and 84, they are applied to the gates of FETs 88 and 86 respectively, causing those FETs to conduct or be inhibited, and causing the leads carrying the corresponding $\overline{OUT}$ or OUT signal to be at high logic level or pulled to ground.

The invention thus achieves a delay line having a delay of each delay stage equal to the delay through a single inverter. A delay line can be realized having equal delay steps, with substantially no degradation of the input clock duty cycle. There is clean transition of the output signal while adding or deleting a single delay stage, and no power is dissipated by the unused delay stages.

It should be noted that the above-described delayed clock generator can be used within a delay locked loop, or outside a delay locked loop in another useful circuit. Further, the non-inverting delay cell itself can be used by itself or in series with others in another useful circuit.

A person understanding this invention may now conceive of alternative structures and embodiments or variations of the above. All those which fall within the scope of the claims appended hereto are considered to be part of the present invention.

I claim:

1. A digital delay line having variable delay comprising means for receiving an input clock signal and for providing an inverted and non-inverted version thereof, a plurality of serially connected delay cells each comprised of a pair of inverters, each delay cell having a fixed delay and providing an inverted and a non-inverted output, a first delay cell for receiving and translating the inverted and non-inverted versions of the input clock signal, successive delay cells each receiving and translating the inverted and non-inverted output of a preceding stage, inverted and non-inverted outputs of each of the delay cells except a last delay cell in said plurality being directly cross-connected to inputs of an immediately following delay cell, and means for shunting outputs of a delay cell to a pair of output nodes.

2. A delay line having variable delay comprising a plurality of serially connected delay cells, each delay cell having a fixed delay, each delay cell comprising a single inverter stage formed of a first inverter and a second inverter, an input of said first inverter of a first delay sell being connected to an input line carrying a clock signal and an input of said second inverter of said first delay cell being connected to an input line carrying an inverted clock signal, outputs of each delay cell except a last delay cell being crosscoupled to input terminals of a respectively immediately following delay cell, and means for shunting outputs of said first and second inverters of one of the delay cells to an output buffer for provision of opposite logic level output signals.

3. A delay line as defined in claim 1 in which each delay cell is further comprised of two pairs of FETs having their sources and drains connected in series, one serially connected pair of FETs being connected between an output of a first inverter of the pair of inverters and ground, and the other serially connected pair of FETs being connected between an output of a second inverter of the pair of inverters and ground, means for providing a control input to each of the pair of inverters and to the gates of the FETs connected to ground, the output of said first inverter being connected to the gate of a FET connected to the second inverter, and the output of said second inverter being connected to the gate of a FET connected to the first inverter.

* * * * *